United States Patent
Vajana et al.

(10) Patent No.: US 6,501,147 B1
(45) Date of Patent: Dec. 31, 2002

(54) PROCESS FOR MANUFACTURING ELECTRONIC DEVICES COMPRISING HIGH VOLTAGE MOS TRANSISTORS, AND ELECTRONIC DEVICE THUS OBTAINED

(75) Inventors: Bruno Vajana, Bergamo (IT); Matteo Patelmo, Trezzo Sull'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/713,144

(22) Filed: Nov. 14, 2000

(30) Foreign Application Priority Data

Nov. 19, 1999 (EP) .............................. 99830717

(51) Int. Cl.⁷ .............................................. H01L 29/00
(52) U.S. Cl. ...................... 257/500; 257/501; 257/506; 257/550; 257/315; 257/318
(58) Field of Search ................................ 257/500, 501, 257/506, 550, 315, 316, 318

(56) References Cited

U.S. PATENT DOCUMENTS

| | | | | |
|---|---|---|---|---|
| 5,024,960 A | * | 6/1991 | Haken | 437/34 |
| 5,047,358 A | * | 9/1991 | Kosiak et al. | 437/34 |
| 5,158,463 A | * | 10/1992 | Kim et al. | 437/34 |
| 5,472,887 A | * | 12/1995 | Hutter et al. | 437/34 |
| 5,607,868 A | | 3/1997 | Chida et al. | 437/34 |

FOREIGN PATENT DOCUMENTS

| | | | |
|---|---|---|---|
| GB | 2 016 801 | | 9/1979 |
| GB | 2016801 A | * | 9/1979 |
| JP | 58087858 | | 5/1983 |
| JP | 03177065 A | * | 8/1991 |
| JP | 03177065 | | 8/1991 |
| JP | 06151783 | | 5/1994 |
| JP | 07273212 | | 10/1995 |
| JP | 10189762 A | * | 7/1998 |

* cited by examiner

*Primary Examiner*—Nathan J. Flynn
*Assistant Examiner*—Remmon R. Fordé
(74) *Attorney, Agent, or Firm*—Lisa K. Jorgenson; E. Russell Tarleton; SEED IP Law Group PLLC

(57) ABSTRACT

A process for manufacturing an electronic device having an HV MOS transistor with a low multiplication coefficient and a high threshold in a non-implanted area of the substrate, this area having the same conductivity type and the same doping level as the substrate. The transistor is obtained by forming, over the non-implanted substrate area, a first gate region of semiconductor material having the same doping type as the non-implanted substrate area; and forming, inside the non-implanted substrate area, first source and drain regions of a second conductivity type, arranged at the sides of the first gate region. At the same time, a dual-gate HV MOS transistor is formed, the source and drain regions of which are housed in a tub formed in the substrate and having the first conductivity type, but at a higher concentration than the non-implanted substrate area. It is moreover possible to form a nonvolatile memory cell simultaneously in a second tub of the substrate of semiconductor material.

9 Claims, 9 Drawing Sheets

PROCESS FOR MANUFACTURING ELECTRONIC DEVICES COMPRISING HIGH VOLTAGE MOS TRANSISTORS, AND ELECTRONIC DEVICE THUS OBTAINED

TECHNICAL FIELD

The present invention pertains to a process for manufacturing electronic devices comprising high voltage MOS transistors, and an electronic device thus obtained.

BACKGROUND OF THE INVENTION

Many electronic devices currently present on the market use both NMOS and PMOS high voltage transistors (hereinafter referred to as HV transistors) of the dualgate type (i.e., having the gate region doped with doping ionic species of the same type used for the source and drain regions) and of the drain-extension type. In these manufacturing processes, in order to achieve lengths of the channels of the HV transistors of less than 0.5 $\mu$m it is necessary to appropriately increase the doping of the substrate so as to prevent undesired effects, such as punchthrough, i.e., the undesired electrical connection between two regions having different potentials. For this reason, the region designed to house these transistors is enriched with doping ions that may confer on the region the same conductivity type as the substrate, forming a well (or tub) that has a doping level greater than the substrate.

In many devices it is, however, also indispensable to have HV transistors with a low multiplication coefficient (i.e., with a low ratio between the current flowing in the drain region and the current flowing in the substrate) and with a low body effect (i.e., a reduced increase in the threshold voltage of the transistor when the substrate biasing voltage increases), which features require a low doping of the substrate.

A commonly adopted solution to this problem is that of suitably shaping the masks so as to form so-called "NO-TUB" HV transistors formed directly in the substrate, instead of in the well or tub.

Since these transistors have a low multiplication coefficient but also a low threshold voltage, they can be used only with appropriate circuit designs to prevent unacceptable parasitic currents. On the other hand, such designs lead to an undesired complication of the circuitry associated to the HV transistors.

SUMMARY OF THE INVENTION

The disclosed embodiment of the present invention provides a new process for manufacturing electronic devices comprising HV transistors with a low multiplication coefficient, a low body effect, and a high threshold.

According to the embodiment of the present invention, a process for manufacturing electronic devices comprising HV transistors includes providing a substrate of semiconductor material with a first area having a first conductivity type and a first doping level; forming a first gate region of semiconductor material of the first transistor on the first area of the substrate; and forming in the first area of the substrate, first source and drain regions of a second conductivity type, at the sides of the gate regions, and doping the first gate region with doping species determining the first conductivity type.

In accordance with another aspect of the present invention, the foregoing process includes the step of forming a second high voltage MOS transistor in a second area of the substrate and the step of forming the second high voltage transistor includes: Forming, in the second area of the substrate, a first tub having the first conductivity type and a doping level higher than the first area of the substrate; forming a second gate region having the second conductivity type over the first tub; and forming in the first tub source and drain regions of the second conductivity laterally to the second gate region.

In accordance with yet another aspect of the present invention, the forming of the first source and drain regions and forming of the second source and drain regions is performed simultaneously.

BRIEF DESCRIPTION OF THE DRAWINGS

For a better understanding of the present invention, a preferred embodiment thereof is now described, purely as a non-limiting example, with reference to the attached drawings in which.

DETAILED DESCRIPTION OF THE INVENTION

The following description refers to an embodiment of HV NMOS transistors of a traditional type (and hence with a high multiplication coefficient), HV NMOS transistors with a low multiplication coefficient and a high threshold, and EEPROM memory cells including a selection transistor and a memory transistor.

Figure 1:
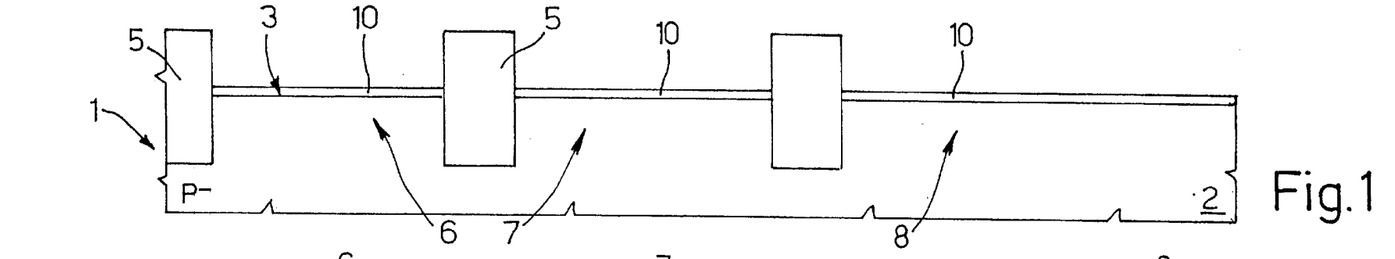
FIG. 1 shows a cross-section through a wafer in an initial step of the manufacturing process according to the present invention.

In FIG. 1, a wafer 1 comprising a substrate 2 of P-type monocrystalline silicon has undergone the steps of definition of the active areas. In detail, in a per se known manner, thick oxide regions (field oxide regions 5) have already been formed in the substrate 2, these regions delimiting between them active areas of the substrate that are to house various components of the device to be formed. In particular, FIG. 1 shows three such active areas: a first active area 6 for housing first HV transistors having a low multiplication coefficient and a high threshold (hereinafter also referred to as NO-TUB HV transistors), a second active area 7 for housing second HV transistors having a high multiplication coefficient, and an active matrix area 8 for housing EEPROM memory cells. Further active areas (not shown in the drawings) are generally provided for forming LV NMOS and PMOS transistors or HV PMOS transistors.

Figure 2:
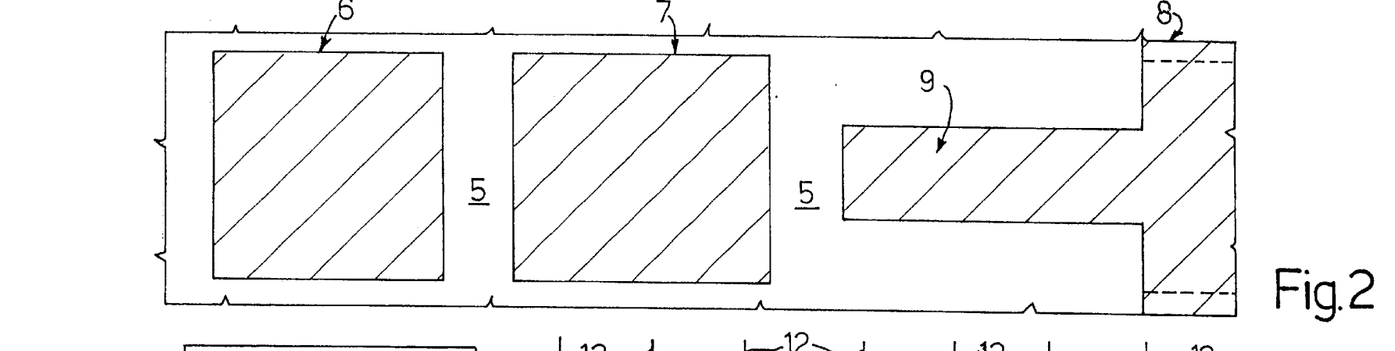
FIG. 2 presents a top view of the wafer of FIG. 1.

In detail and in a per se known manner, the active matrix area 8 defines a grid, of which FIG. 2 shows in full only the part regarding a cell, indicated by 9, having basically the shape of a T rotated through 90°.

A sacrificial oxide layer 10 extends on the surface 3 of the substrate 2.

Figure 3:
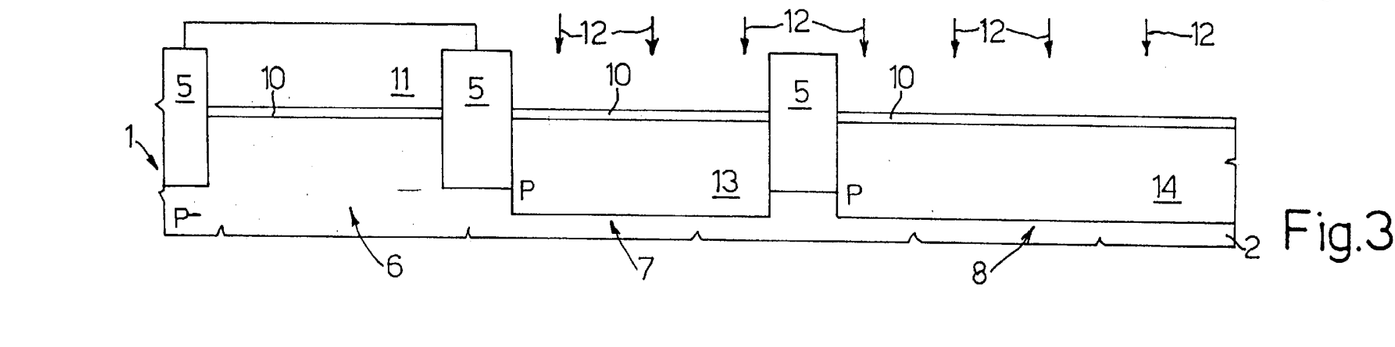
FIGS. 3–9 show cross-sections similar to that of FIG. 1 during successive manufacturing steps.

Subsequently, as shown in FIG. 3, an HV P-well resist mask 11 is formed which covers the entire surface of the wafer 1, except for the second active area 7 and the active matrix area 8, and P-type doping species are implanted, as schematically represented by arrows 12. The implant gives rise to an HV P-type tub 13 in the second active area 7 and to a P-matrix tub 14 in the active matrix area 8. The HV P-type tub 13 and P-matrix tub 14 thus have the same conductivity type as the substrate 2, but a higher doping concentration. In contrast, the first active area 6 is not implanted to enable formation of the NO-TUB HV transistors.

Figure 4:
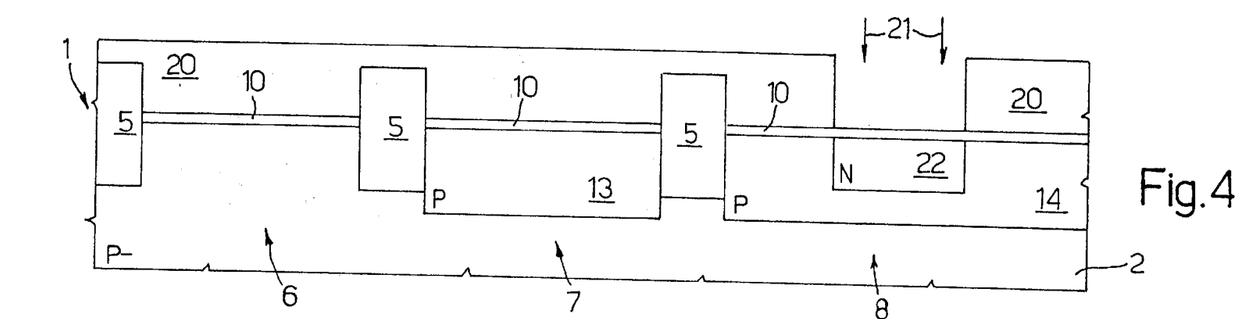

After removing the HV P-well mask 11, a capacitor mask 20 is formed which covers the entire surface of the wafer 1, except for strips perpendicular to the plane of the drawing. Next, N-type doping species (e.g., phosphorus) are implanted, as represented schematically in FIG. 4 by arrows 21. N-type continuity regions 22 are then formed inside the P-matrix tub 14 providing electrical continuity between each selection transistor and the respective memory transistor of each cell.

Figure 5:
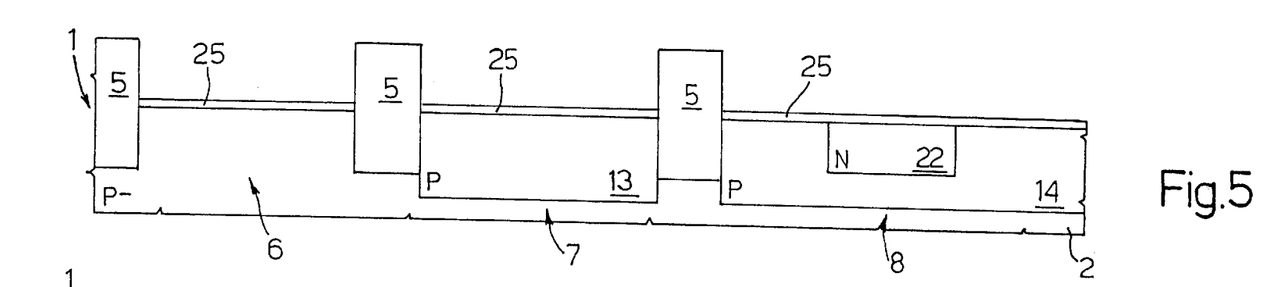
Figure 6:
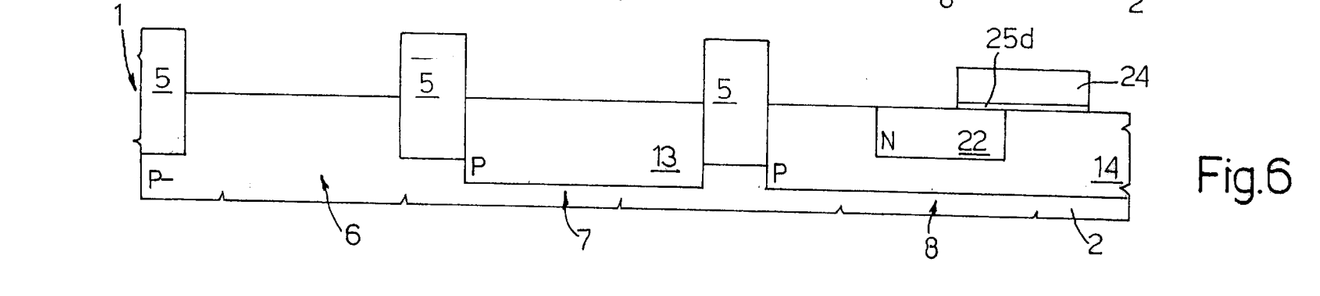

After removing the capacitor mask 20, the wafer 1 is annealed, the sacrificial layer 10 is removed, and matrix oxidation is carried out, so as to form a matrix oxide layer 25 over the surfaces of all the active areas 6, 7, 8, as shown in FIG. 5. Next, using a matrix oxide mask 24 which covers only the wafer 1 above the P-matrix tub 14, where the gate regions of the memory transistors are to be formed, the matrix-oxide layer 25 is removed where it is uncovered to form a matrix oxide region 25d in the P-matrix region 14 partially covering the continuity region 22 (FIG. 6).

Figure 7:
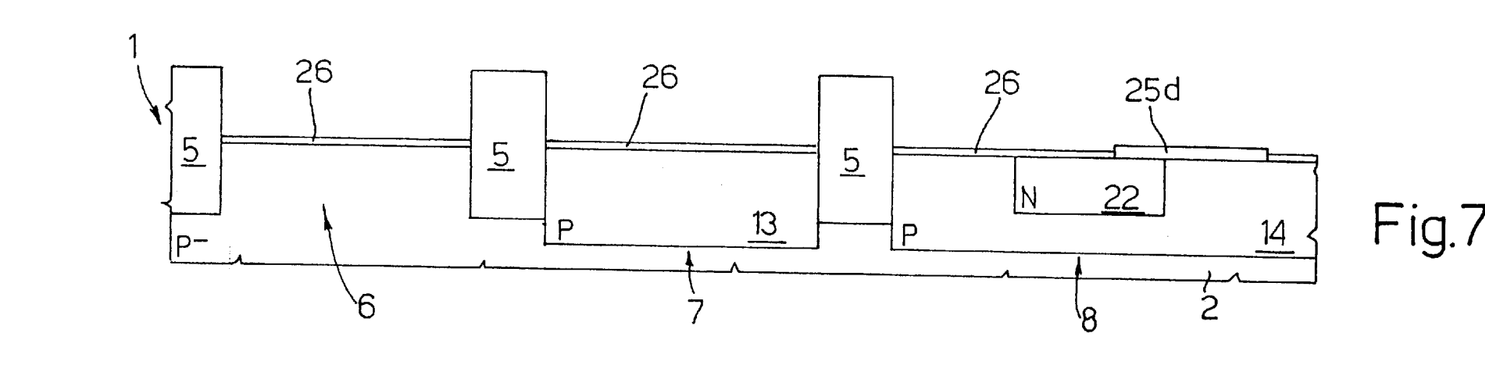

After removing the matrix oxide region 24, the wafer 1 is again oxidized to form a tunnel oxide layer 26 over the entire surface 3 of the wafer 1, where the latter is exposed, and the thickness of the matrix oxide region 25d increases. In this way, the structure of FIG. 7 is obtained.

Figure 8:
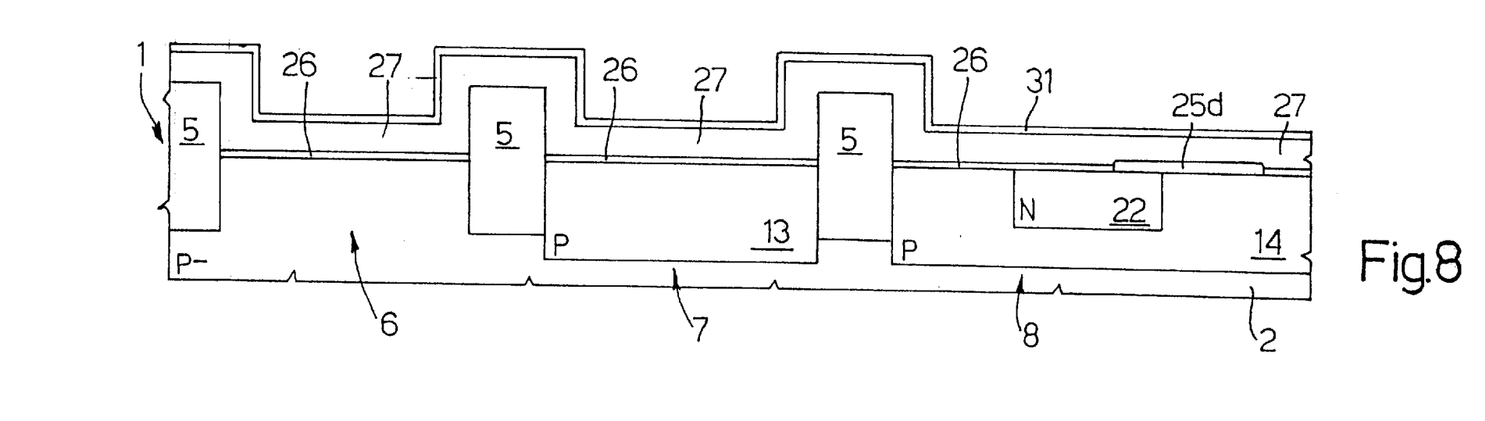

A first polycrystalline silicon layer (poly1 layer 27) is then deposited and appropriately doped. Subsequently, an interpoly dielectric layer 31 is formed, for example comprising a triple ONO (silicon oxide - silicon nitride - silicon oxide) layer, as shown in FIG. 8.

Figure 9:
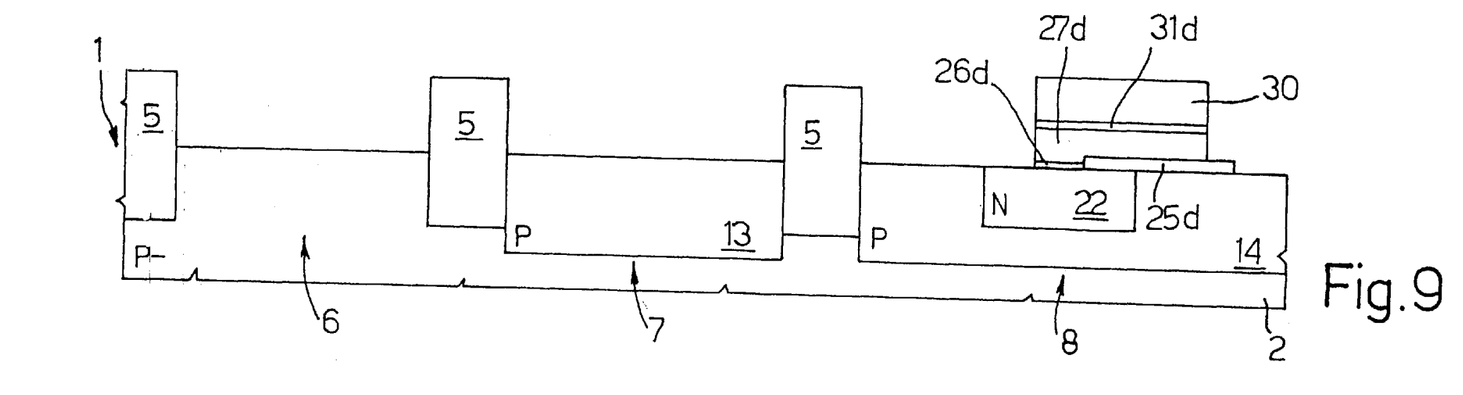
Figure 10:
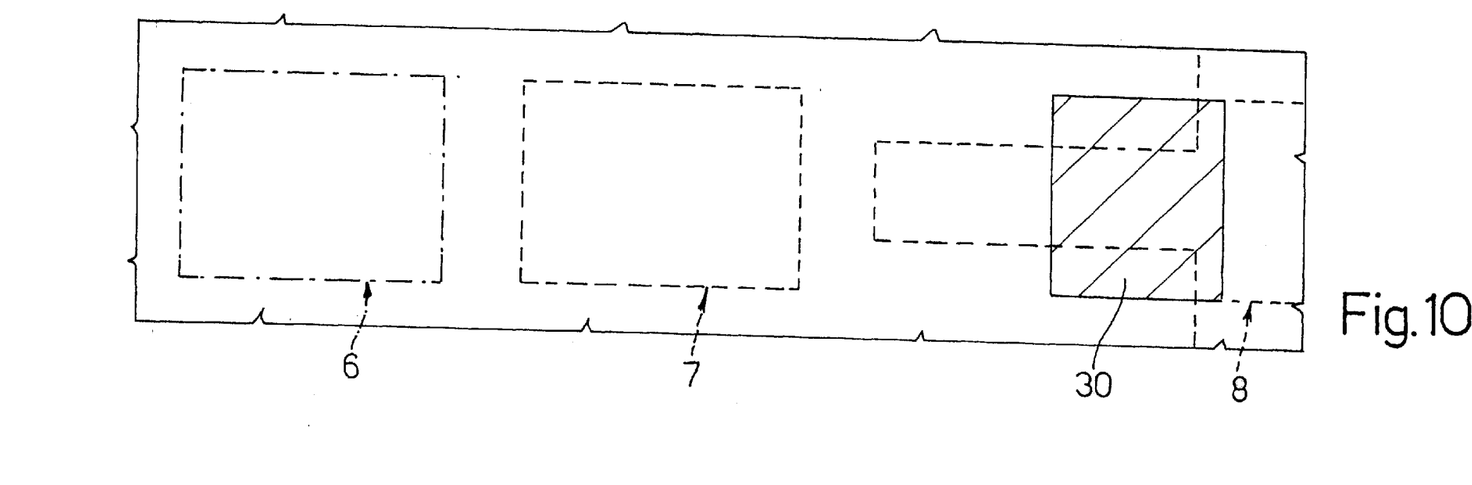
FIG. 10 presents a top view of the wafer of FIG. 9.

A floating gate mask 30 is then formed, as shown in FIGS. 9 and 10. Next, the dielectric layer 31, the poly1 layer 27, and the tunnel oxide layer 26 are etched to form an interpoly dielectric region 31d, a floating gate region 27d, and a tunnel region 26d, which are aligned with respect to each other.

Figure 11:
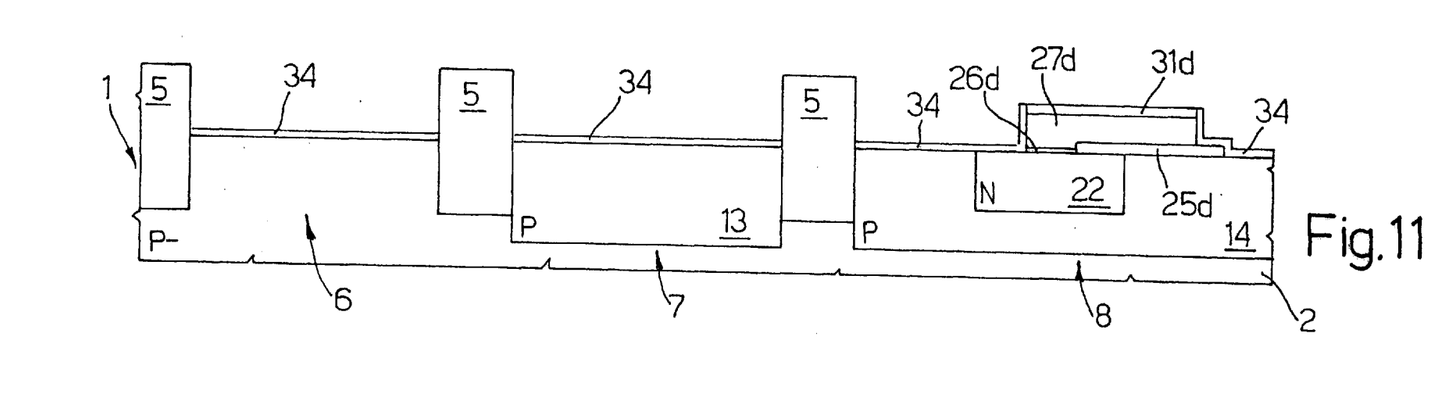
FIGS. 11–13 show cross-sections similar to that of FIG. 9 during successive manufacturing steps.

After removing the floating gate mask 30, an HV oxidation step is carried out, thus forming an HV gate oxide layer 34 over the entire free surface of the wafer 1 (FIG. 11). Portions of oxide 34 are formed also at the sides of the floating gate region 27d of the memory transistor, as illustrated in FIG. 11.

Figure 12:
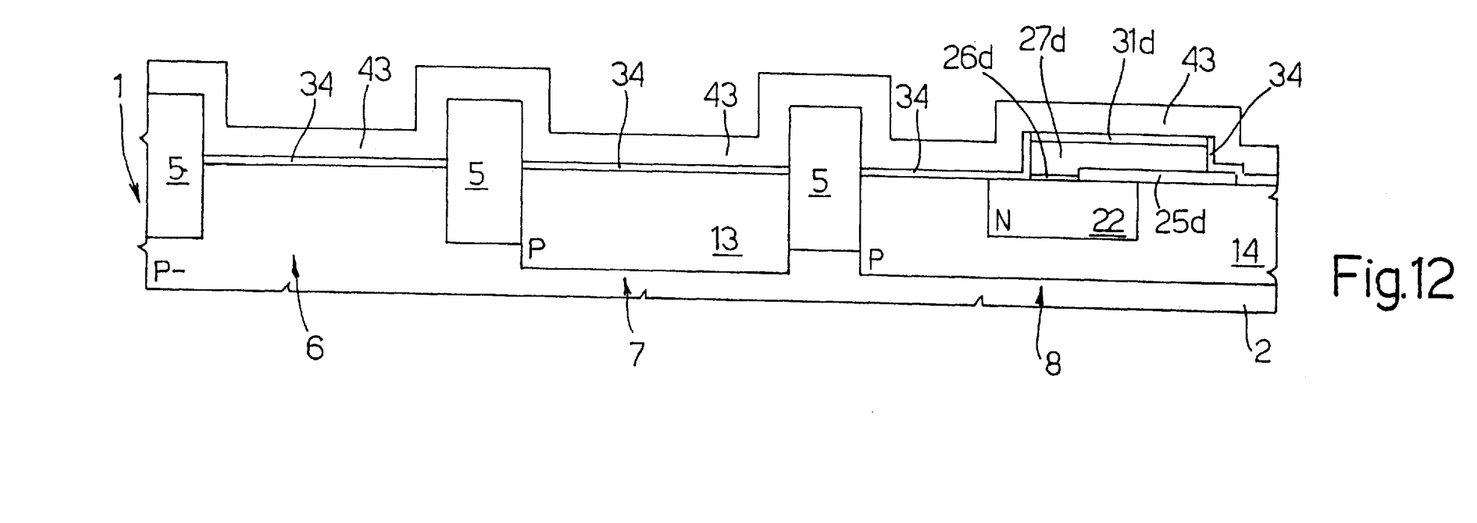
Figure 13:
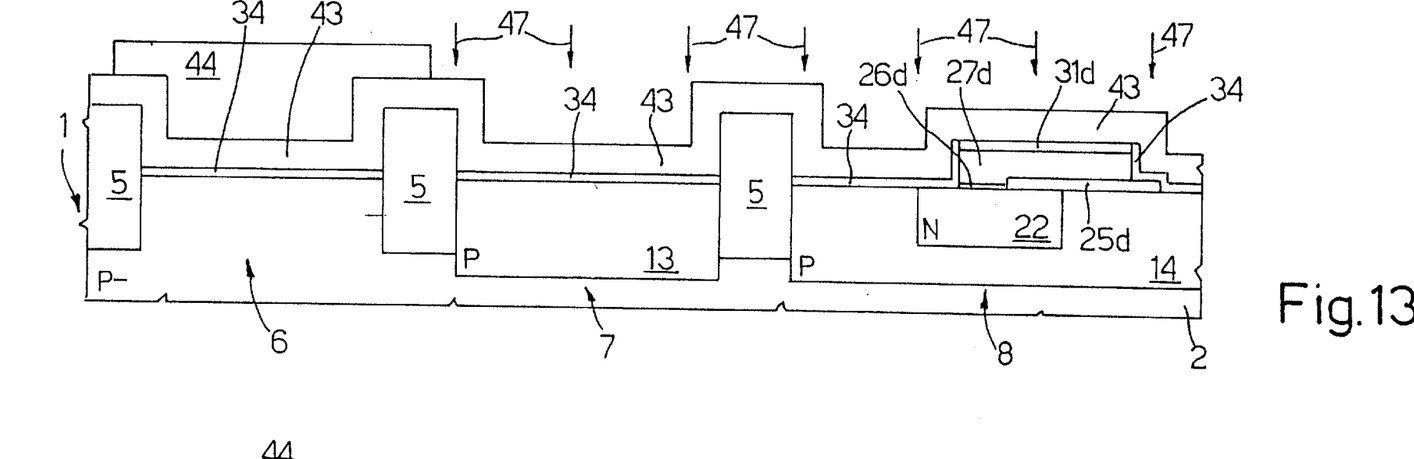
Figure 14:
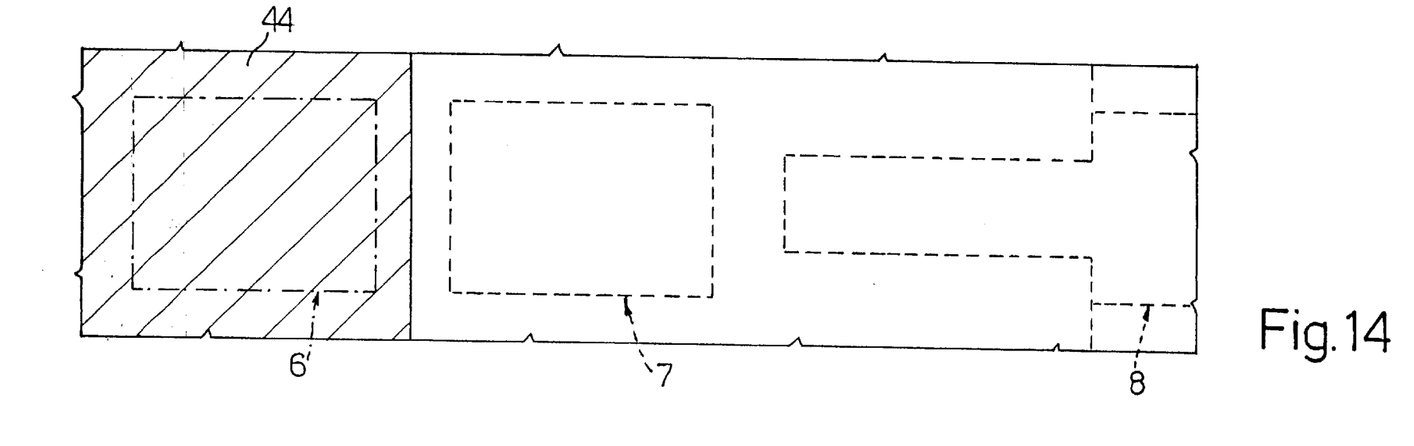
FIG. 14 presents a top view of the wafer of FIG. 13.

A second polycrystalline silicon layer (poly2 layer 43, not doped) is then deposited, as shown in FIG. 12. A dual-gate doping mask 44 is then formed and covers the active area 6, as shown in FIGS. 13 and 14, and then N-type doping ionic species are implanted, as represented schematically by arrows 47 in FIG. 13. In this way, the portions of the poly2 layer 43 over the HV P tubs 13 and P-matrix tubs 14 undergo N-type doping.

Figure 15:
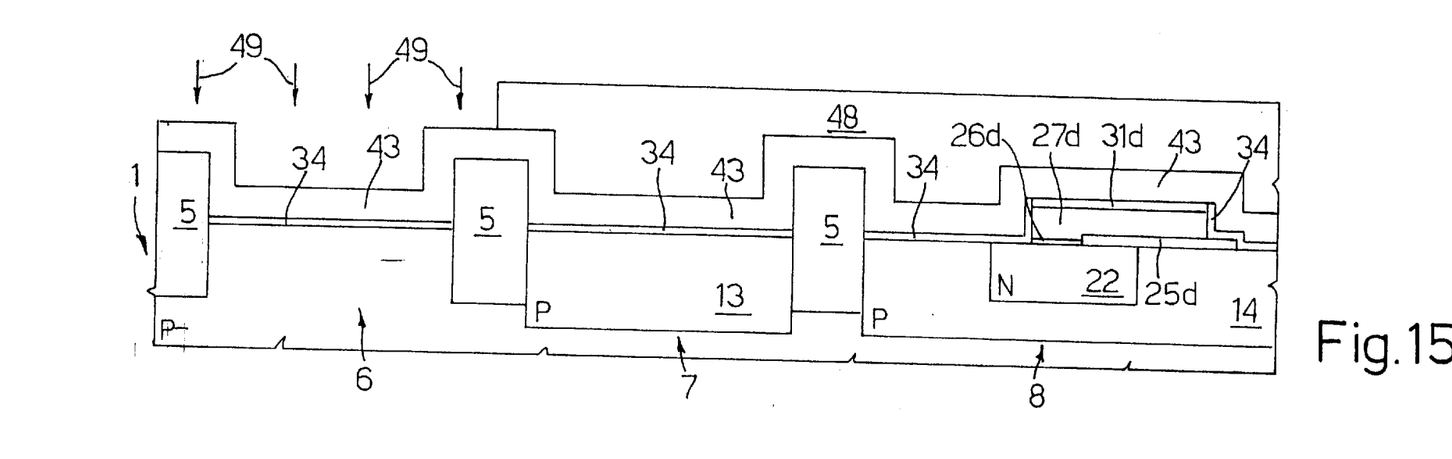
FIG. 15 shows a cross-section similar to that of FIG. 11 in a subsequent manufacturing step.
Figure 16:
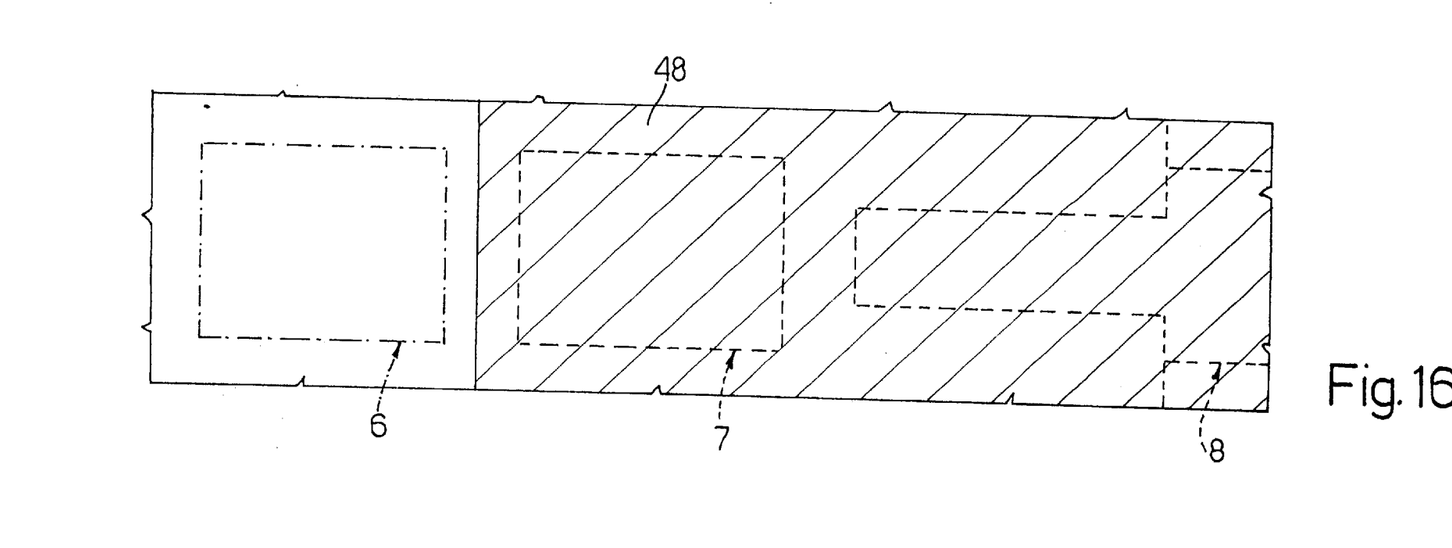
FIG. 16 presents a top view of the wafer of FIG. 15.

Next, using a selective doping mask 48, which covers the HV P tubs 13 and P-matrix tubs 14, P-type doping ionic species, for example boron, are implanted, as represented schematically by arrows 49 in FIG. 15. In this way, the portion of the poly2 layer 43 which extends over the active areas 6 and is to form gate regions of the NO-TUB HV transistors undergoes P-type doping so as to present the same conductivity type as the substrate 2. Thereby, the structure shown in cross-section in FIG. 15 and in top view in FIG. 16 is obtained.

Figure 17:
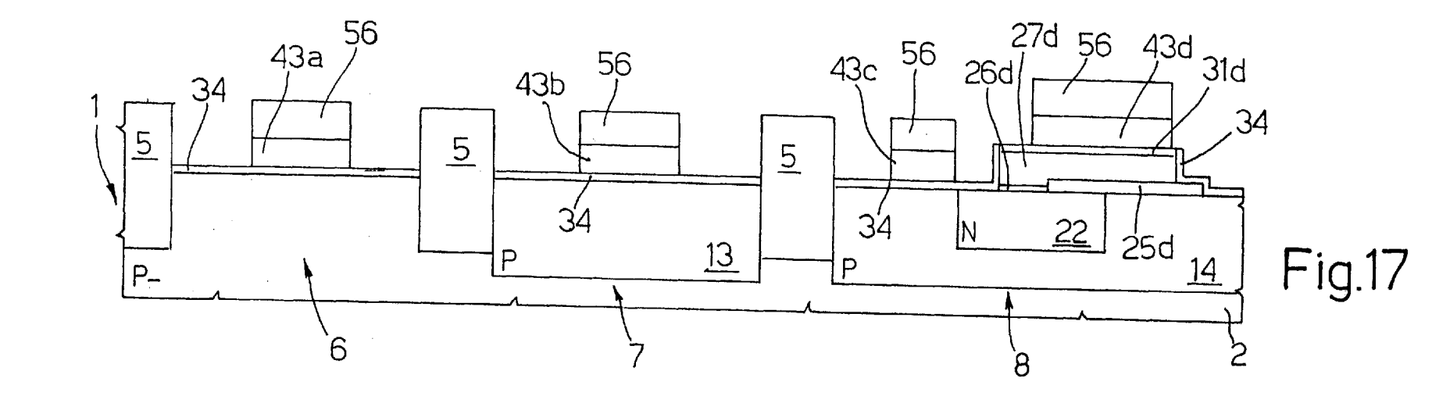
FIG. 17 shows a cross-section similar to that of FIG. 15 in a subsequent manufacturing step.
Figure 18:
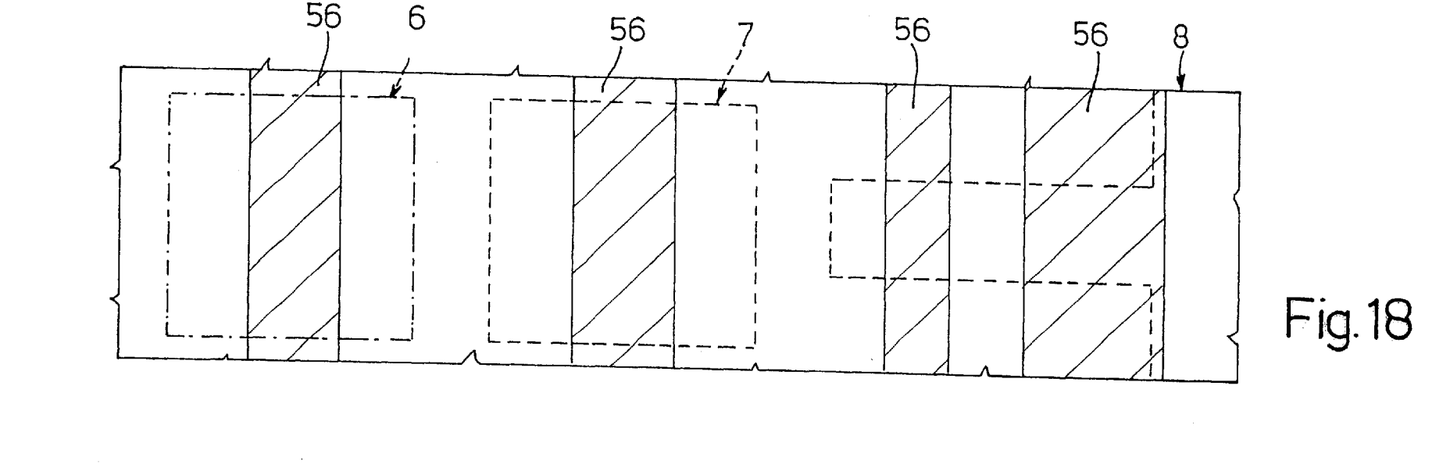
FIG. 18 presents a top view of the wafer of FIG. 17.

Next, using an HV gate mask 56, the poly2 layer 43 is selectively removed to form a gate region 43a, which is P-type doped, of the NO-TUB HV transistor, a gate region 43b, which is N-type doped, of the TUB HV transistor, a gate region 43c of the selection transistor of the memory cell, and a control gate region 43d of the memory transistor.

Figure 19:
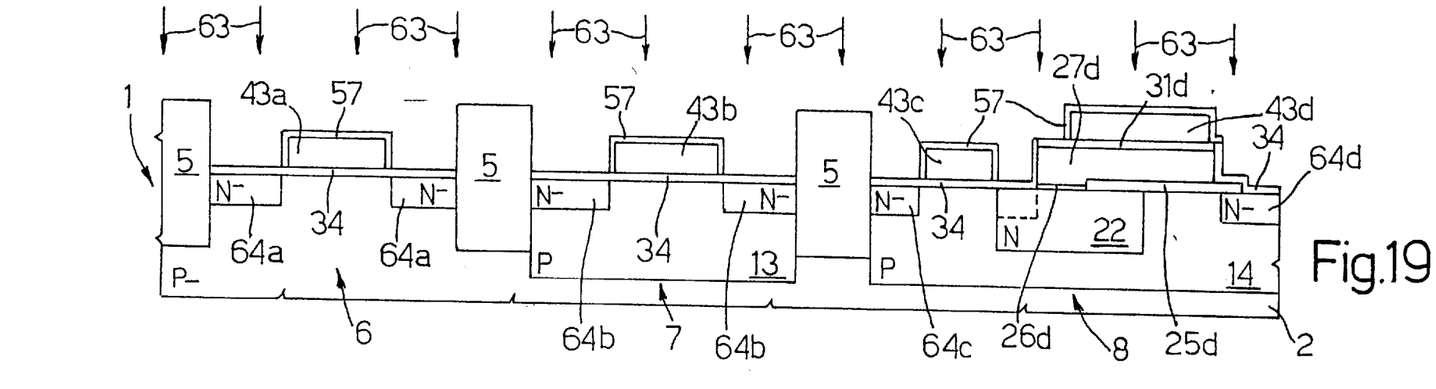
FIGS. 19-20 show cross-sections similar to that of FIG. 17 in successive manufacturing steps.

Next, a re-oxidation step is carried out, thus forming an oxide layer 57 over the entire free surface of the wafer 1, in particular at the sides of the gate regions 43a and 43b of the NO-TUB HV transistor and of the TUB HV transistor, as illustrated in FIG. 19.

Subsequently, N-type doping ionic species are implanted, as represented schematically by arrows 63 in FIG. 19. In the active area 6 and in the HV P tub 13 at the two sides of the HV gate region 43a of the NO-TUB HV transistor and of the HV gate region 43b of the TUB HV transistor, N-type source and drain regions 64a, 64b are formed.

Thus, the source and drain regions 64a of the NO-TUB HV transistor are doped in an opposite way with respect to their HV gate region 43a, whereas the source and drain regions 64b of the TUB HV transistor are doped in the same way as their HV gate region 43b. At the same time, in the P-matrix tub 14 the following regions are formed: a drain region 64c of the selection transistor, on one side and self-aligned with respect to the gate region 43c of the selection transistor; and a source region 64d of the memory transistor, on the side of the latter not facing the selection transistor, aligned with the gate region 43d of the memory transistor. In addition, an implant is carried out also on the area arranged between the selection transistor and the memory transistor; however, this implant is generally performed within the continuity regions 22, which are more doped, and hence is not visible (for this reason, the corresponding area has been represented by dashed lines in FIG. 19). In the event of misalignments, however, this implant guarantees electrical continuity.

Figure 20:
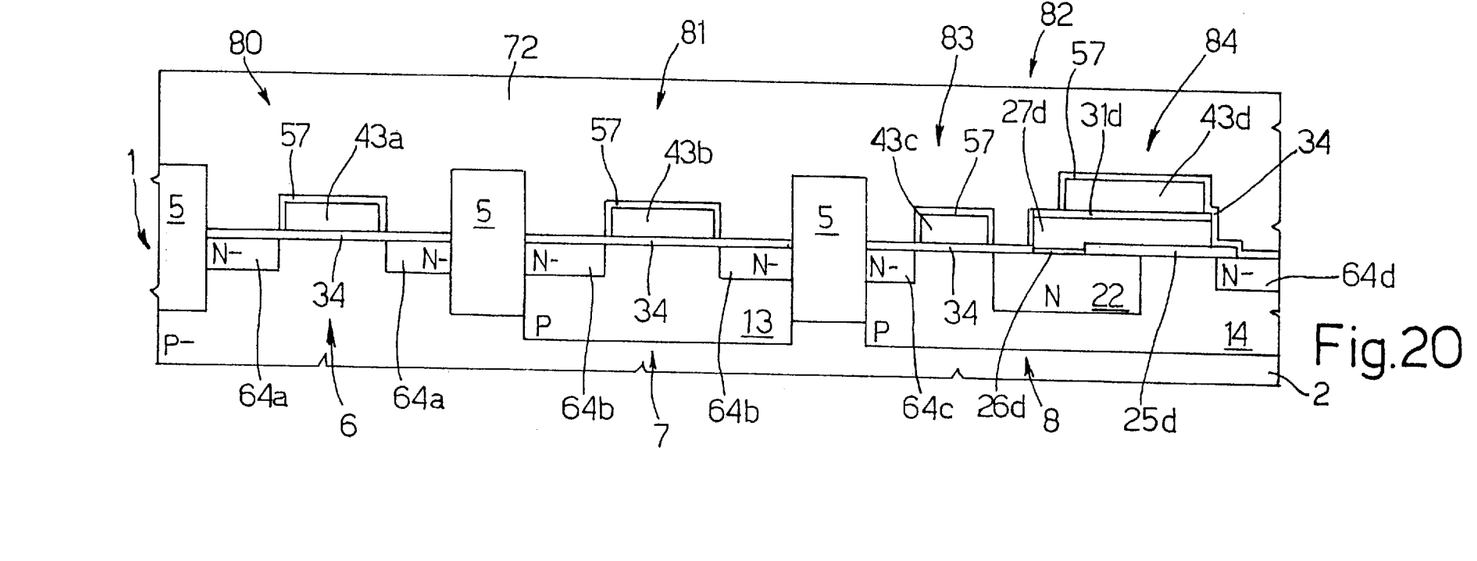

After a protective dielectric layer 72 has been formed, the final structure of FIG. 20 is obtained, showing: a NO-TUB HV NMOS transistor 80 with P-type doped gate region 43a, a TUB HV NMOS transistor 81 with N-type doped gate region 43b, and hence of a dual-gate type, and an EEPROM cell 82 including a selection transistor 83 and a memory transistor 84. Final steps are the carried out, including forming the contacts and the electrical interconnection lines, depositing a passivation layer, etc.

The method described thus enables TUB HV transistors and NO-TUB HV transistors to be formed at the same time, as well as memory cells having very different characteristics, optimizing the number of steps required.

In particular, the fact that the gate regions 43a of the NO-TUB HV transistors have the same conductivity type as the substrate 2 ensures a high work function (i.e., a high potential difference automatically present between materials because of the physical characteristics of the materials), and hence a high threshold voltage. Since the source and drain regions 64a are formed directly in the substrate 2, where a more doped tub is not present and the substrate 2 is not very doped, the NO-TUB HV transistors have a low multiplication coefficient and low body effect.

In this way, using a dual-gate process, it is also possible to obtain high threshold HV transistors, so avoiding the complex circuit solutions necessary for their use in prior art processes.

Finally, it is clear that numerous modifications and variations may be made to the method and device described and illustrated herein, all of which falling within the scope of the invention, as defined in the attached claims and the equivalents thereof. For example, it is possible to form NO-TUB HV PMOS transistors, which will consequently have an N-type doped gate region, like the substrate, and P-type doped source and drain regions. Furthermore, the order of the steps for selectively doping the gate regions 43a, 43b and the control gate region 43d can be reversed, and these regions can be doped after they have been shaped, instead of before as has been described herein, possibly adjusting the implant dose of the source and drain regions 64a of the NO-TUB HV transistors.

What is claimed is:

1. An electronic device, comprising:
    a substrate of semiconductor material having a first area with a first conductivity type and a first doping level; and
    a first high voltage MOS transistor, said first transistor comprising a first gate region of semiconductor material having a first conductivity type over said first area of said substrate to define a non-implanted channel in said substrate; first source and drain regions of a second conductivity type, housed in said first area of said substrate, at the sides of said gate regions.

2. The electronic device of claim 1, wherein said substrate further comprises a first tub having said first conductivity type and a doping level higher than that first area of said substrate;
    and further comprising a second high voltage MOS transistor, said second transistor comprising a second gate region having said second conductivity type and being arranged over said first tub, and second source and drain regions of said second conductivity type housed in said first tub at the sides of said second gate region.

3. The electronic device of claim 2, wherein said substrate further comprises a second tub having said first conductivity type and a doping level higher than said first area of said substrate; and further comprising a nonvolatile memory cell including a floating gate region over said second tub; a control gate region of said second conductivity type over said floating gate region; and third source and drain regions of said second conductivity type housed in said second tub at the sides of said floating gate region.

4. The electronic device of claim 3, wherein said nonvolatile memory cell comprises an EEPROM cell.

5. The electronic device of claim 2 wherein said first conductivity type is P-type, and said second conductivity type is N-type.

6. An electronic device, comprising:
    a substrate of semiconductor material having a first area with a first conductivity type and a first doping level;
    a first high voltage MOS transistor, said first transistor comprising a first gate region of semiconductor material having a first conductivity type over the first area of the substrate;
    first source and drain regions of a second conductivity type housed in the first area of the substrate at the sides of the gate regions;
    a first tub formed in the substrate having the first conductivity type and a doping level higher than the first area of the substrate; and
    a second high voltage MOS transistor comprising a second gate region having the second conductivity type and arranged over the first tub, and second source and drain regions of the second conductivity type housed in the first tub at the sides of the second gate region.

7. An electronic device, comprising:
    a substrate of semiconductor material having a first area with a first conductivity type and a first doping level;
    a first high voltage MOS transistor, said first transistor comprising a first gate region of semiconductor material having a first conductivity type over the first area of the substrate;
    first source and drain regions of a second conductivity type housed in the first area of the substrate at the sides of the gate regions;
    a first tub formed in the substrate having the first conductivity type and a doping level higher than the first area of the substrate;
    a second high voltage MOS transistor comprising a second gate region having the second conductivity type and arranged over the first tub, and second source and drain regions of the second conductivity type housed in the first tub at the sides of the second gate region;
    a second tub having the first conductivity type and a doping level higher than the first area of the substrate; and
    a nonvolatile memory cell including a floating gate region formed over the second tub; a control gate region of the second conductivity type over the floating gate region; and third source and drain regions of the second conductivity type housed in the second tub at the sides of the floating gate region.

8. An electronic device, comprising:
    a substrate of semiconductor material having a first area with a first conductivity type and a first doping level;
    a first high voltage MOS transistor, said first transistor comprising a first gate region of semiconductor material having a first conductivity type over the first area of the substrate;
    first source and drain regions of a second conductivity type housed in the first area of the substrate at the sides of the gate regions;
    a first tub formed in the substrate having the first conductivity type and a doping level higher than the first area of the substrate;
    a second high voltage MOS transistor comprising a second gate region having the second conductivity type and arranged over the first tub, and second source and drain regions of the second conductivity type housed in the first tub at the sides of the second gate region;
    a second tub having the first conductivity type and a doping level higher than the first area of the substrate; and
    a nonvolatile EEPROM memory cell having a floating gate region formed over the second tub; a control gate region of the second conductivity type over the floating gate region; and third source and drain regions of the second conductivity type housed in the second tub at the sides of the floating gate region.

9. An electronic device, comprising:

a substrate of semiconductor material having a first area with a P-type conductivity and a first doping level;

a first high voltage MOS transistor, said first transistor comprising a first gate region of semiconductor material having a P-type conductivity over the first area of the substrate;

first source and drain regions of a N-type conductivity housed in the first area of the substrate at the sides of the gate regions;

a first tub formed in the substrate having the P-type conductivity and a doping level higher than the first area of the substrate; and a second high voltage MOS transistor comprising a second gate region having the N-type conductivity and arranged over the first tub, and second source and drain regions of the N-type conductivity housed in the first tub at the sides of the second gate region.

* * * * *